Figure 1:
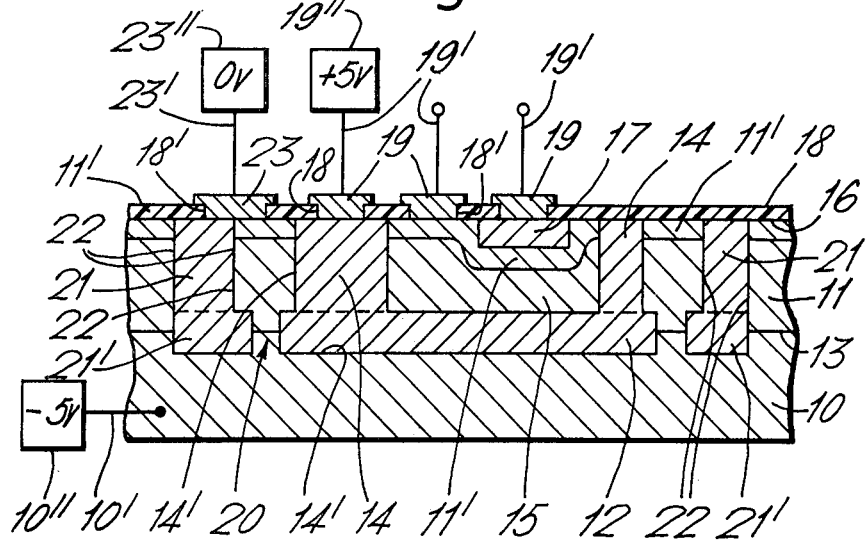

United States Patent [19]

Kane

[11] 4,160,990

[45] Jul. 10, 1979

[54] SEMICONDUCTOR DEVICES AND CIRCUIT ARRANGEMENTS INCLUDING SUCH DEVICES

[75] Inventor: Jeffrey Kane, Hulme, England

[73] Assignee: Ferranti Limited, Hollinwood, England

[21] Appl. No.: 855,256

[22] Filed: Nov. 28, 1977

[30] Foreign Application Priority Data

Nov. 27, 1976 [GB] United Kingdom ............... 49577/76

[51] Int. Cl.² ............................................ H01L 27/04
[52] U.S. Cl. ........................................ 357/48; 357/51; 357/52; 357/55
[58] Field of Search ......................... 357/48, 51, 52, 55

[56] References Cited

U.S. PATENT DOCUMENTS 4,038,680   7/1977   Yagi et al. ................................ 357/48

*Primary Examiner*—Edward J. Wojciechowicz
*Attorney, Agent, or Firm*—Cameron, Kerkam, Sutton, Stowell & Stowell

[57] ABSTRACT

A circuit arrangement at least partially embodied in a collector-diffusion-isolation (CDI) type device, in a semiconductor body comprising a thin layer initially wholly of one conductivity type on a substrate of the same conductivity type, has at least one component comprising a modification of previously known CDI type constructions i.e. with a combination of regions of the opposite conductivity type comprising a buried layer at the interface between the thin layer and the substrate, and an isolation barrier for the component extending through the thin layer to contact the buried layer, the modification comprising providing at least one outer annular region of the opposite conductivity type, adjacent to the surface of the thin layer remote from the substrate, and uniformly spaced from the combination of regions, there being a resistive component part between the outer annular region and the combination of regions, such that in the operation of the circuit arrangement, the device does not breakdown when a potential difference up to substantially twice the breakdown potential of the outer P-N junction of a component of any previously known CDI type consturction, and at least of 10 volts, is applied across the device, and/or controlled breakdown of the component of the device of the modified CDI type contruction takes place, but the breakdown current, flowing between regions of the device beyond the component and the combination of regions of the component, being reduced by the presence of the resistive part between the outer annular region and the combination of regions of the component.

28 Claims, 6 Drawing Figures

SEMICONDUCTOR DEVICES AND CIRCUIT ARRANGEMENTS INCLUDING SUCH DEVICES

This invention relates to semiconductor devices, and to circuit arrangements including such devices, and in particular to devices each in a semiconductor body initially wholly comprising a thin layer of one conductivity type on a substrate of the same conductivity type, the device having a plurality of constituent components, at least one of the components with a combination of regions comprising a buried layer of the opposite conductivity type at a portion of the interface between the thin layer and the substrate, and an isolation barrier of the opposite conductivity type for the component, the isolation barrier extending through the thin layer to the buried layer, within the device the constituent components are substantially electrically isolated from each other within the semiconductor body by regions of the device, of said one conductivity type, and beyond each such component, but contiguous with each such component.

Said at least one of the components of the device may comprise a collector-diffusion-isolation (CDI) bipolar transistor. A known construction for a CDI bipolar transistor is provided in a semiconductor body initially wholly comprising a thin epitaxial layer on a substrate of the same conductivity type, the collector comprising the combination of the buried layer and the isolation barrier, the collector defining a base of unmodified epitaxial material, and an emitter of the opposite conductivity type being provided within the base and adjacent to the surface of the epitaxial layer remote from the substrate. Other types of component can have closely resembling constructions to that of the known CDI bipolar transistor construction, such as a field-effect transistor and a resistor. Such components will be referred to as CDI-type components of the known constructions, including known CDI bipolar transistors constructions, and irrespective of whether or not the thin layer comprises an epitaxial layer, or whether or not the region of said one conductivity type defined by the combination of regions is of unmodified material of the thin layer.

All CDI-type components may be provided by the same processing steps as are required to form CDI bipolar transistors of the known constructions. Further, for a device, in a monolithic semiconductor body, a plurality of different CDI-type components may be provided simultaneously by the same processing steps as are required to form the CDI bipolar transistors of the device. For convenience, in this specification such components will be referred to as CDI-type components, and include CDI-type components of the known constructions as referred to above. Conveniently, but not essentially, all the constituent components of each device to which the present invention relates are CDI-type components. These processing steps are advantageous in forming a semiconductor device, particularly a device including bipolar transistors, because they are fewer in number than the processing steps required to provide some other known forms of bipolar transistor, each CDI bipolar transistor occupies a smaller part of the contact-bearing surface of the semiconductor body of the device than some other known forms of bipolar transistor, and hence the manufacturing yields are higher.

Within any component, of any construction, portions of a P-N junction adjacent to a surface of the semiconductor body of the device breakdown when a lower potential difference is applied across them compared with the breakdown potential difference of portions of the same P-N junction remote from the surfaces of the semiconductor body. Consequently, it is possible to consider that only the portions of a P-N junction adjacent to a surface of the semiconductor body tend to breakdown.

Whilst all CDI-type components of the known constructions have low-voltage breakdown potential differences associated therewith, it is especially so when, as is conventional, there is provided, in a non-selective diffusion process step before the emitter diffusion process step, heavily doped portions of said one conductivity type adjacent to the surface of the thin layer remote from the substrate, and within all the regions of the thin layer of said one conductivity type. Such heavily doped surface portions are advantageous because, inter alia, they are not likely to change inadvertantly their conductivity type, and they surround within the semiconductor body the emitters of CDI bipolar transistors of the device to increase the gain-bandwidth product of the transistors. However, the presence of the heavily doped surface portions of said one conductivity type causes the breakdown potential difference of surface portions of P-N junctions of the device to be lower than otherwise would be the case.

Whilst the breakdown characteristics of each P-N junction of a CDI-type component of a device are substantially identical, it is usual for the circuit arrangement including the device to be such that the internal P-N junctions within the components of the known constructions do not breakdown, and for convenience in this specification such an assumption will be made, generally it being possible easily to obtain this criterion.

A disadvantage of each CDI-type component of the known constructions is that the outer P-N junction, serving partially to define the combination of the buried layer and the isolation barrier, breaks down when a potential difference is applied across the P-N junction less than that for the breakdown of the corresponding P-N junction of the same component of some different types of construction. Such an outer P-N junction of each CDI-type component of the known constructions breaks down when a potential difference of less than 10 volts is applied across the P-N junction.

It is conventional in the operation of a device including, say, NPN CDI transistors, for the regions of the device beyond each constituent component, and contiguous with the components, to be maintained at a potential level of $-5$ volts. In some forms of apparatus including the device it is required that parts of such a device, including CDI-type components of the known constructions, are to be connected to a point to be maintained at a potential level of $+5$ volts, for example, such a point comprising a supply rail maintained at this potential level for associated transistor-transistor logic (TTL) devices of the apparatus. However, as indicated above, the outer P-N junction serving partially to define the combination of regions of CDI-type components of the known constructions breaks down when a potential difference of less than 10 volts is applied across the outer P-N junction. Such a breakdown inevitably will occur with devices wholly having CDI-type components of the known constructions, and in the apparatus referred to above.

For certain applications, controlled breakdown of a component of a device may be employed, but advantageously the breakdown current should be as low as possible.

It is an object of the present invention to provide devices each with a plurality of constituent components, at least one component, comprising a CDI-type component, with a construction such that, the component has a higher breakdown potential difference associated therewith, i.e., of at least 10 volts, than for CDI-type components of the known constructions, and/or the component is capable of controlled breakdown with a lower breakdown current associated therewith than for CDI-type components of the known constructions, the breakdown current flowing between the regions of the device beyond the component and the combination of regions of the component.

According to the present invention a semiconductor device, in a semiconductor body comprising a thin layer initially wholly of one conductivity type, on a substrate of the same conductivity type, has a plurality of constituent components, at least one of the components with a combination of regions comprising a buried layer of the opposite conductivity type at a portion of the interface between the thin layer and the substrate, and an isolation barrier of the opposite conductivity type for the component, the isolation barrier extending through the thin layer to the buried layer, there being regions of the device and of said one conductivity type beyond said at least one component, but contiguous with said at least one component, and said at least one component is provided with at least one outer annular region of the opposite conductivity type, adjacent to the surface of the thin layer remote from the substrate, and uniformly spaced from the combination of regions, between said at least one outer annular region and the combination of regions there being a component part with a significant resistance.

Said at least one component comprises a CDI-type component, capable of being formed by the same processing steps as the CDI bipolar transistors of known constructions. The other components of the device each may comprise CDI-type components, and possibly CDI-type components of the known constructions.

Said at least one component may comprise any type of component, such as a bipolar transistor, or a field effect transistor, or a resistor.

Said at least one outer annular region, or the surface portion of the region between said at least one outer annular region and the isolation barrier, or both, of said at least one component, may be maintained at a suitable predetermined potential level, intermediate between the potential level of the combination of regions, and the potential level of the regions of the device beyond, and contiguous with, said at least one component, and the former, predetermined potential level usually is maintained substantially midway between the latter potential levels. If any such component part is not maintained at a predetermined potential, the potential level of such a component part is considered to be floating. In any event, the circuit arrangement is required to be such that, in operation, the potential level of said at least one outer annular region, and/or the surface portion of the region between said at least one outer annular region and the combination of regions, of said at least one component of the device, is intermediate between the potential level of the combination of regions, and the potential level of the regions of the device, beyond but contiguous with, said at least one component.

In one type of operation of the device, for any such circuit arrangement, if the outer P-N junction serving partially to define the combination of regions of said at least one component breaks down, at portions of the P-N junction adjacent to said surface of the semiconductor body, a current flows through the resistive component part. The presence of the resistive component part, when such a current flows, has the effect of reducing the potential difference between the combination of regions of said at least one component and the regions of the device beyond the component, and contiguous with the component. In the limiting state, when the conditions are such that, just, no current flows through the resistive component part, the breakdown potential difference between the combination of regions of the component and the regions of the device beyond the component is higher than would be the case without the presence of the resistive component part, and is at least of 10 volts. This breakdown potential difference may be up to substantially twice the breakdown potential difference associated with the outer P-N junction serving partially to define the combination of regions of a CDI-type component of the known constructions; or up to the sum of the breakdown potential differences associated with the outer P-N junction serving to define the outer annular region of said at least one component. The resistance of the resistive component part is required to have a value sufficient to obtain the desired breakdown potential difference between the combination of regions and the regions of the device beyond the component, and contiguous with the component.

The potential difference between said at least one outer annular region and the regions of the device beyond said at least one component, and contiguous with said at least one component, is required to be such that the outer part of the P-N junction serving to define the outer annular region does not breakdown. It is immaterial whether or not the inner part of this P-N junction, serving to define the outer annular region, breaks down.

In another type of operation of a device the outer P-N junction serving partially to define the combination of regions of said at least one component is allowed to breakdown in a controlled manner. A breakdown current flows between the regions of the device beyond the component and the combination of regions of the component, but this breakdown current is limited, in an advantageous manner, by the resistive component part between the combination of regions and said at least one outer annular region of the component. The breakdown potential difference between the combination of regions of the component and the regions of the device beyond the component, and contiguous with the component, in this type of operation of the device, may be higher than otherwise would be the case because of the presence of the resistive component part between the combination of regions and said at least one outer annular region of the component. It is essential to provide means for removing breakdown current which flows to the regions of the device beyond said at least one component.

Said at least one component may be operably connected to at least one other component of the device, said at least one other component having a combination of regions comprising a buried layer of the opposite conductivity type at a portion of the interface between the thin layer and the substrate, and an isolation barrier of the opposite conductivity type for said at least one other component, the isolation barrier extending through the thin layer to the buried layer, the circuit arrangement being such that a larger potential difference is provided between the combination of regions of said at least one component, and the regions of the device beyond, and contiguous with, said at least one component, compared with the potential difference provided between the combination of regions of said at least one other component, and the regions of the device beyond, and contiguous with, said at least one other component.

Said at least one outer annular region of said at least one component may not extend to the interface between the thin layer and the substrate. When the device is considered in plan i.e. when viewed normally incident onto the thin layer of the semiconductor body of the device, the buried layer of the combination of regions of said at least one component may extend to be directly opposite to, but is spaced from, at least part of said at least one outer annular region of the component. Thus, the resistive component part may be substantially wholly between the part of the extension of the buried layer directly opposite to said at least one outer annular region, and said at least one outer annular region.

Alternatively, said at least one outer annular region of at least one component extends to the interface between the thin layer and the substrate, and includes a buried layer at the interface. When the device is considered in plan, the buried layer of the combination of regions of said at least one component may extend beyond the isolation barrier. Alternatively, or in addition, when the device is considered in plan, the buried layer of said at least one outer annular region, at the interface between the thin layer and the substrate, extends beyond the remainder of said at least one outer annular region, and towards the combination of regions. Thus, in any such arrangement, the resistive component part may be substantially wholly between the buried layer of said at least one outer annular region, at the interface between the thin layer and the substrate, and the buried layer of the combination of regions.

It is desirable, in order to avoid parasitic four layer action within said at least one component, to provide a connection between said at least one outer annular region, and the surface portion of the region between said at least one outer annular region and the isolation barrier of said at least one component, so that the component parts connected together are at a common potential level. Conveniently, the connection comprises a contact spanning a surface portion of the P-N junction between these component parts, and especially if these component parts are required to be maintained at a predetermined potential level.

A plurality of spaced, outer annular regions may be provided in said at least one component adjacent to the surface of the thin layer remote from the substrate, and the plurality of outer annular regions being uniformly spaced from each other, a resistive component part being provided between each outer annular region and the combination of regions of said at least one component. Such a device is capable of any type of operation referred to above. In one type of operation, each outer annular region may be maintained at a predetermined potential level intermediate between the potential level of the combination of regions of the component and the potential level of the regions of the device beyond the component, and contiguous with the component, the potential differences between each of the outer annular regions and the combination of regions increasing as the distances between the outer annular regions and the combination of regions increases. The breakdown potential difference between the combination of regions and the regions of the device beyond the component, for a component with a plurality of outer annular regions, may be greater than for a component with only one outer annular region.

According to another aspect the present invention comprises a circuit arrangement at least partially embodied in a semiconductor device of any one of the constructions referred to above, and the circuit arrangement also including means to maintain at least two spaced points of the device at different potential levels, the circuit arrangement being such that the potential level of at least one of the constituent parts of said at least one component of the device comprising said at least one outer annular region, and the surface portion of the region between said at least one outer annular region and the combination of regions, is intermediate between the potential level of the combination of regions, and the potential level of the regions of the device beyond, but contiguous with, said at least one component.

All the circuit arrangement except the sources of potential may be embodied in the device.

Figure 2:
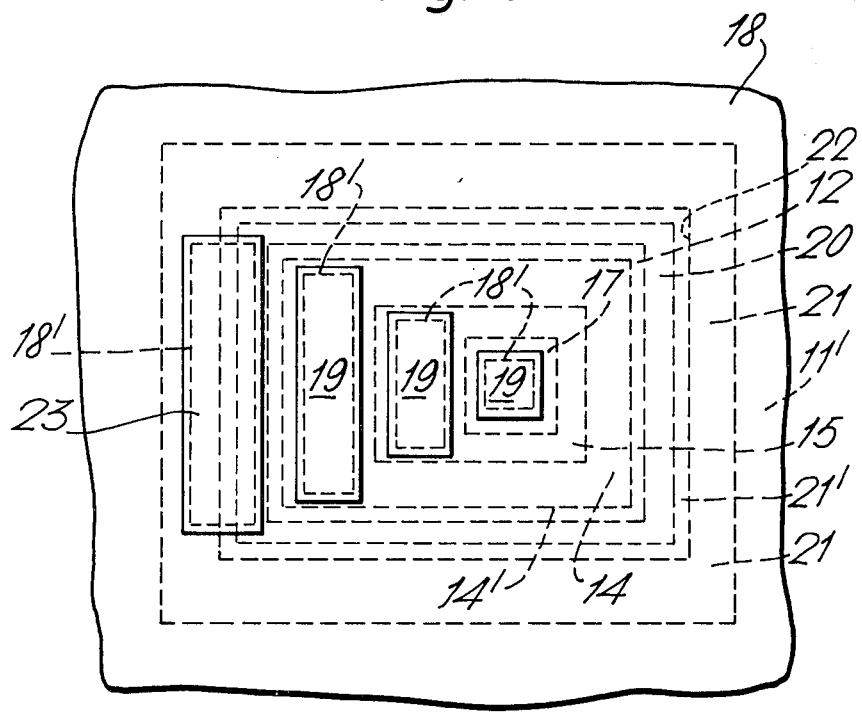
Figure 3:
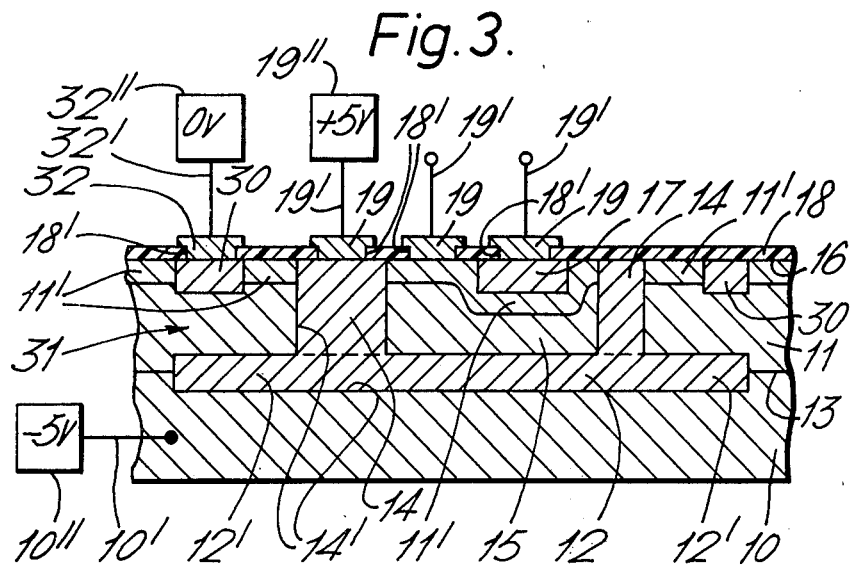
Figure 4:
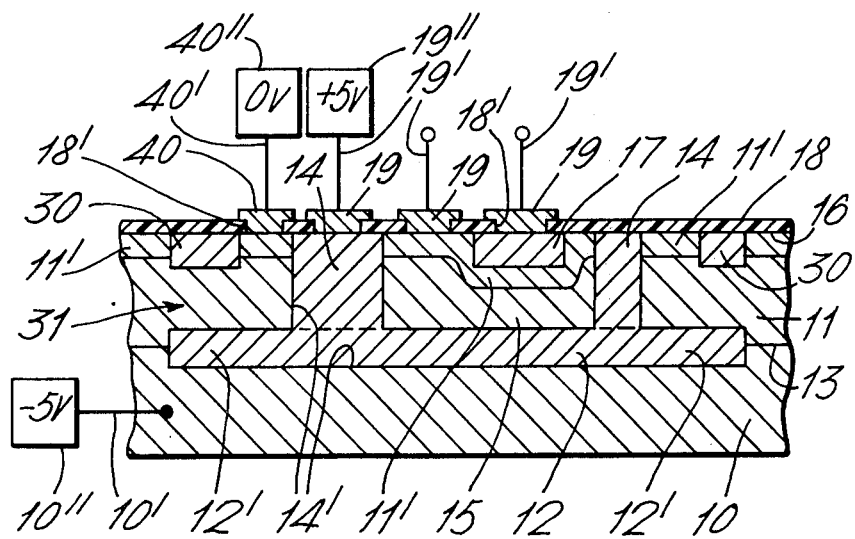
Figure 5:
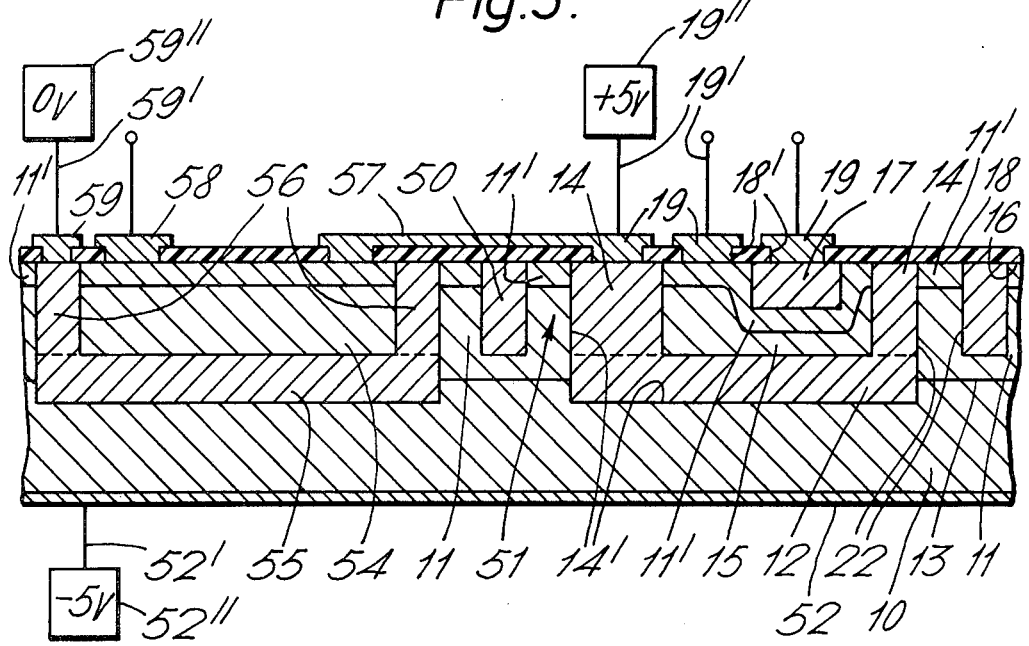
Figure 6:
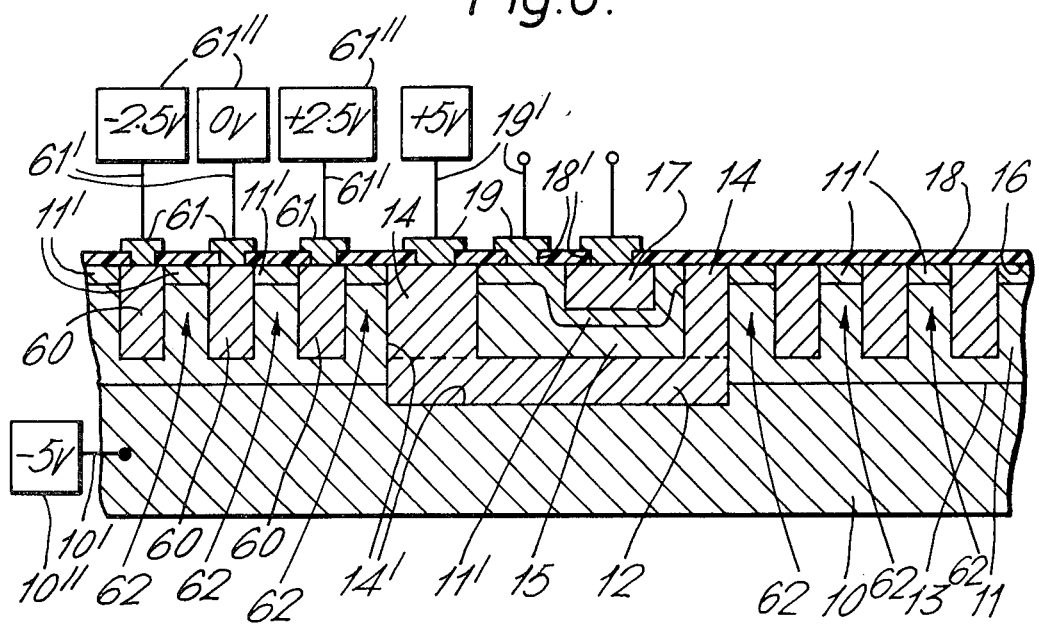

The present invention will now be described by way of example with reference to the accompanying drawings, in which:

FIG. 1 is a section of part of a device comprising one embodiment according to the present invention, the illustrated part comprising a CDI bipolar transistor having associated therewith a high-voltage breakdown potential difference, greater than 10 volts, and having an outer annular region, FIG. 2 is a plan view of the illustrated part of the device of FIG. 1, FIG. 3 is a section of part of a device comprising another embodiment according to the present invention, the illustrated part comprising a modified form of the CDI bipolar transistor of FIGS. 1 and 2, and having associated therewith a high-voltage breakdown potential difference, greater than 10 volts, FIG. 4 is of a modification of the CDI bipolar transistor of FIG. 3, FIG. 5 is of a modification of the CDI bipolar transistor of FIGS. 1 and 2, this transistor having a lower voltage breakdown potential difference than the transistor of FIGS. 1 and 2, but has a construction suitable to be employed when controlled breakdown of the transistor is to occur; and the transistor also is shown as being connected to a CDI-type resistor construction of the device, the resistor comprising a CDI-type component of a known construction, and FIG. 6 is of yet a further modification of the CDI bipolar transistor of FIGS. 1 and 2, this transistor having three outer annular regions.

The NPN CDI bipolar transistor, formed by known processing steps, and shown in FIGS. 1 and 2, is a component of a device in a silicon semiconductor body comprising a P-type substrate 10, with a P-type thin epitaxial layer 11 thereon. A buried N+ type layer 12 is provided at a portion of the interface 13 between the substrate 10 and the thin layer 11. An N+ type isolation barrier 14 for the transistor extends through the thin layer 11 to contact the buried layer 12. The combination of the buried layer 12 and the isolation barrier 14 comprises the collector of the transistor, and defines a base 15 of unmodified epitaxial material. Within the base 15, and adjacent to the surface 16 of the thin layer 11 remote from the substrate 10, is provided an N+ type emitter 17. A passivating layer of silicon oxide 18 is provided on the surface 16, and the transistor contacts 19 extend through apertures 18′ in the passivating layer to the isolation barrier/collector, to the base, and to the emitter. Electrical connections 19′ are provided for the contacts 19 so that the different contacts can be maintained at different, predetermined potential levels, by being connected to potential sources. Only the potential source 19″ connected to the collector 12, 14 is shown.

In the plan view of FIG. 2, for the sake of clarity, the passivating layer 18 is omitted, although the apertures 18′ through the passivating layer for the contacts 19 are indicated by broken lines. The surface portions of the P-N junctions of the component are indicated by chain-dotted lines of one form. The contacts 19 are indicated by continuous lines.

Portions of each P-N junction of any component, of any construction, of the semiconductor device, and adjacent to a surface of the semiconductor body of the device, breakdown when a lower potential difference is applied across them compared with the breakdown potential difference of portions of the same P-N junction remote from the surface. Consequently, it is possible to consider that only the portions of a P-N junction adjacent to the surface breakdown.

Whilst the breakdown characteristics of each P-N junction of components of the device are substantially identical, it is usual for a circuit arrangement, including the device, to be such that the internal P-N junctions within the components do not breakdown, generally it being possible easily to obtain this criterion.

The present invention relates to semiconductor devices each having a plurality of components, with at least one component formed by the same processing steps as the CDI bipolar transistor of FIGS. 1 and 2, as so far described. Any such component, including a CDI bipolar transistor, is referred to as a CDI-type component; and may comprise a field-effect transistor or a resistor instead of a bipolar transistor.

As so far described the CDI bipolar transistor of FIGS. 1 and 2, has a known construction. CDI-type components having a construction closely resembling that of CDI bipolar transistor of FIGS. 1 and 2, and as so far described, and including a CDI bipolar transistor, are referred to as a CDI-type components of the known constructions.

A disadvantage of known CDI-type component constructions is that the outer P-N junction of each such component, serving to define partially the combination of the isolation barrier and burried layer of the component, breaks down when a potential difference is applied across the P-N junction less than that for the breakdown of the corresponding P-N junction of the same component of some different types of construction, i.e. with a potential difference of less than 10 volts.

Whilst all CDI-type components of the known constructions have low-voltage, breakdown potential differences associated therewith it is especially so when, as is conventional, there is provided for the CDI-type components, P+ type portions 11′ adjacent to the surface 16 of the semiconductor body, and within all otherwise unmodified P-type regions of the epitaxial layer 11. The P+ type surface portions 11′ are provided in a non-selective diffusion process step before the provision of the emitter 17. Such heavily doped surface portions 11′ are advantageous because, inter alia, they are not likely to change inadvertently their conductivity type, and they surround within the semiconductor body the emitters of the CDI bipolar transistors of the device to increase the gain-bandwidth product of the transistors. However, the presence of the heavily doped surface portions 11′ causes the breakdown potential difference of surface portions of P-N junctions of the device to be lower than otherwise would be the case.

Within the device the constituent CDI-type components are spaced from each other within the thin layer, and are substantially electrically isolated from each other within the semiconductor body by P-type regions of the device beyond such components, and contiguous with such components.

Conventionally, the P-type regions 10 and 11 of a device beyond each CDI-type component, and contiguous with the components, are maintained at a potential level of −5 volts. An electrical connection 10′ is shown to indicate that the substrate 10 is maintained at such a potential level by a potential source 10″. However, in some forms of apparatus it is required that parts of such a device, such as the collector 12, 14 of the illustrated CDI bipolar transistor, are to be of +5 volts, for example, such a part being connected to the illustrated potential source 19″ comprising a supply rail for associated TTL devices of the apparatus. Thus, a device wholly of CDI-type components of the known constructions inevitably will breakdown in the apparatus referred to above, unless precautions are taken.

In accordance with the present invention the known CDI bipolar transistor construction, and as so far described, is modified as shown in FIGS. 1 and 2 to provide a CDI-type component with a higher breakdown potential difference associated therewith than for CDI-type components of the known constructions, the higher breakdown potential difference being at least of 10 volts.

A resistive part 20, having a significant resistance, is between the collector 12, 14 and an N+ type outer annular region 21. The outer annular region 21 is provided adjacent to the surface 16, and is uniformly spaced from the collector 12, 14 of the transistor by the unmodified region of the thin layer 11 including the resistive part 20. The outer annular region 21 extends through the thin layer 11 and has an N+ type buried layer 21′ at a portion of the interface 13 between the substrate 10 and the thin layer 11. The resistive part 20 is substantially wholly between the buried layers 12 and 21′. The resistive part 20 and the outer annular region 21 are considered to be parts of the CDI bipolar transistor.

In one type of operation of the device, the outer annular region 21 is maintained at a suitable predetermined potential level intermediate between the potential level of +5 volts of the collector 12, 14 as shown in FIG. 1, and the potential level −5 volts of the regions 10 and 11 the device beyond the component, and contiguous with the component. For this purpose a contact 23 is provided on the outer annular region 21, and electrical connection 23′ connects the contact 23 to a potential source 23″. The contact 23 extends through an aperture 18′ in the passivating layer 18. Usually the predetermined potential level of the outer annular region 21 is 0 volts, substantially midway between the potential level of the collector 12, 14 and the potential level of the regions 10 and 11 of the device beyond the component. If the outer P-N junction 14′ serving partially to define the collector 12, 14 breaks down, a current flows through the resistive part 20. The presence of the resistive part, when such a current flows, has the effect of reducing the potential difference between the collector 12, 14 and the regions 10 and 11 of the device beyond the component, and contiguous with the component. In the limiting state, when the conditions are such that, just, no current flows through the resistive part, the breakdown potential difference between the collector 12, 14 and the regions 10 and 11 of the device beyond the component is higher than would be the case without the presence of the resistive part, and is at least of 10 volts. This breakdown potential difference may be up to substantially twice the breakdown potential difference across the outer P-N junction 14' serving partially to define the collector 12, 14; or up to the sum of this breakdown potential difference and the breakdown potential difference associated with the P-N junction 22 serving to define the outer annular region 21.

The resistance of the resistive part is required to have a value sufficient to obtain the desired breakdown potential difference between the collector 12, 14 and the regions 10 and 11 of the device beyond the component, and contiguous with the component. Usually the resistance is arranged to be as large as conveniently may be provided.

The potential difference between the outer annular region 21 and the regions 10 and 11 of the device beyond the component is required to be such that the outer part of the P-N junction 22 serving to define the outer annular region does not breakdown. It is immaterial whether or not the inner part of the P-N junction 22 breaks down.

It is desirable, but not essential, in order to avoid parasitic four layer action within the component to provide a connection between the outer annular region 21 and the surface portion of the region of the thin layer including the resistive part 20, and between the outer annular region 21 and the isolation barrier 14 of the transistor. In the illustrated embodiment this connection is provided by the contact 23 spanning the inner part of the P-N junction 22 serving to define the outer annular region. Thus, the surface portion of the region of the thin layer including the resistive part 20 also is maintained at a predetermined potential level of zero volts.

As shown, the buried layers 12 and 21', respectively, of the collector, and of the outer annular region, extend towards each other, respectively, beyond the isolation barrier 14, and the portion of the outer annular region extending through the thin layer 11, when the device is considered in plan, although these extensions are not essential. In the plan view of FIG. 2, the boundaries of buried layers 12 and 21' not coincident with surface portions of the P-N junctions of the component and indicated by chain-dotted lines of one form, are indicated by chain-dotted lines of a second form.

In one particular embodiment of the device, and for the CDI-type component construction of FIGS. 1 and 2, the breakdown potential difference between the collector 12, 14 and the regions 10 and 11 of the device beyond the component, and contiguous with the component, is 16 volts, twice the breakdown potential difference across with the outer P-N junction 14' serving partially to define the collector 12, 14, and sufficient for it to be practicable to operate the device with 10 volts between the collector and the regions of the device beyond the transistor.

The gap between the buried layers 12 and 21' is arranged to be as small as possible.

Another embodiment of a device according to the present invention includes the CDI bipolar transistor construction shown in FIG. 3. In relation to FIG. 3 the same reference numerals as in FIGS. 1 and 2 are used to identify identical or closely resembling parts of both illustrated embodiments.

The CDI bipolar transistor construction of FIG. 3 differs from that of FIGS. 1 and 2 in that the outer annular region 30 does not extend through the thin layer 11, and so does not have a buried layer. In addition, the buried layer 12 of the collector extends to be beneath at least part of the outer annular region 30, and in the illustrated construction extends beneath the whole of the outer annular region 30. The resistive part 31 is at least partially defined between the outer annular region 30 and the extension 12' of the buried layer beyond the isolation barrier 14 for the transistor, when the device is considered in plan.

Further, a connection between the outer annular region 30 and the region of the thin layer including the resistive part 31 is not provided. A contact 32 is provided through an aperture 18' in the passivating layer 18 to the outer annular region 30, and an electrical connection 32' connects the contact 32 to a potential source 32", so that this region 30 can be maintained at a suitable predetermined potential level, e.g., 0 volts. The potential level of the surface portion of the region between the outer annular region 30 and the isolation barrier 14 of the transistor can be considered to be floating. Thus, no precautions are taken to avoid the possibility of parasitic four layer action occurring within the component.

Any extension 12' of the buried layer of the collector beyond the isolation barrier for the transistor has the effect of increasing the collector-to-substrate capacitance above what otherwise would be obtained. Such an increase in the collector-to-substrate capacitance usually is undesirable, but can be ignored if the collector is connected directly to a supply rail of the device, for example, if the transistor is to operate as an emitter follower. It is when the collector is to be connected directly to a supply rail that it is required that the collector-substrate breakdown potential difference is to be greater than otherwise would be the case i.e., of 10 volts. An alternative device embodying a CDI bipolar transistor of the known constructions to be connected direct to a supply rail would require a disadvantageously large resistor to be connected to the transistor in order to obviate the low collector-substrate breakdown potential difference associated with the known constructions.

The CDI bipolar transistor shown in FIG. 4 is a modification of the transistor of FIG. 3, and parts of the transistor of FIG. 4 closely resembling or identical to the corresponding parts of the transistor of FIG. 3 are given the same reference numerals in both Figures. However, in the transistor shown in FIG. 4, the outer annular region 30 is not provided with a contact, but a contact 40 is provided exclusively to the surface portion of the region of the thin layer 11 between the outer annular region 30, and the isolation barrier 14. The contact 40 is connected to an electrical connection 40', and so is connected to a potential source 40", so as to be maintained at a suitable, predetermined potential level, such as 0 volts, so that a high breakdown potential difference, of at least 10 volts, is obtainable between the isolation barrier 14 and the regions of the device beyond the transistor, but contiguous with the transistor. The potential level of the outer annular region 30 can be considered to be floating. The contact 40 extends through an aperture 18' in the passivating layer 18.

Even though the outer annular region 30 has a floating potential level, this floating potential level is determined by the predetermined potential level of the surface portion of the region of the thin layer between the outer annular region and the isolation barrier of the component.

When the surface portion of the region of the thin layer between the outer annular region and the isolation barrier is maintained at a suitable, predetermined potential level a current flows between this region and the substrate of the semiconductor body, but this current can be small enough not to be disadvantageous.

Generally, breakdown of the collector-base or the emitter-base P-N junctions of the transistor should be avoided.

Whilst a controlled breakdown of the outer P-N junction 14' serving to define partially the collector may be employed in certain applications, it is essential to limit the magnitude of the breakdown current to acceptable values. A satisfactory limitation of the breakdown current is obtained in a CDI-type component of a device in accordance with the present invention by the presence of the resistive component part of any one of the component constructions described above. This type of operation of the device may be in addition to the component having a higher breakdown potential difference between the combination of regions 12, 14 and the regions of the device beyond the component than otherwise would be the case because of the presence of the resistive component part. When controlled breakdown of the outer P-N junction 14' is to occur, the outer annular region, or the surface portion of the region between the outer annular region and the isolation barrier, or both, of the component, either are maintained at a suitable predetermined potential level intermediate between the potential level of the combination of regions and the potential level of the regions of the device beyond the component and contiguous with the component, or they are not maintained at a predetermined potential level, their potential levels being considered to be floating. An example of the latter arrangement is shown in FIG. 5, which shows a modification of the CDI bipolar transistor of FIGS. 1 and 2. Parts of the transistor of FIG. 5 closely resembling or identical to the corresponding parts of the transistor of FIGS. 1 and 2 are given the same reference numerals in both Figures.

However, the transistor shown in FIG. 5 does not have the contact spanning a portion of the P-N junction between the outer annular region 50 and the region 51 of the thin layer between the outer annular region 50 and the collector 12, 14. Because, in operation, these regions can be considered as having potential levels which are floating, the breakdown potential difference between the combination of regions 12, 14 and the regions of the device beyond the component, although higher than otherwise would be the case, because of the presence of the resistive component part 51, is lower than for the arrangement of FIGS. 1 and 2, and may be either above or below 10 volts. Further the outer annular region 50 does not have a buried layer at the interface 13 between the substrate 10 and the thin layer 11, and the resistive component part 51 is between the outer annular region 50 and the isolation barrier 14.

When a breakdown current flows to the substrate 10 of the device it is essential to provide means to remove this current from the substrate, and for this purpose a contact 52, to be maintained at an appropriate predetermined potential level from a potential source 52" at −5 V, via a connection 52', is provided on the substrate 10.

It is possible to provide a connection between the outer annular region 50 and the surface portion of the region 51 of the thin layer between the outer annular region and the isolation barrier of the component, even though these parts are not to be maintained at a predetermined potential level, but in order to prevent parasitic four layer action within the component. Even though these parts are not to be maintained at a predetermined potential level, the connection between these parts may comprise a contact on the semiconductor body, such as the contact 23 of the transistor of FIGS. 1 and 2, the contact not being connected to a potential source.

As referred to above it is usual, when forming a CDI bipolar transistor, to provide in a non-selective diffusion step, before the emitter diffusion step, P+ type surface portions 11' for the unmodified parts of the thin layer. If a controlled breakdown of the outer P-N junction 14' of the collector is permitted in operation, as referred to above, the presence of the outer annular region causes the breakdown current flow to be directed away from the P+ type surface portions 11' of the unmodified region of the thin layer including the resistive component part, which is advantageous.

As also is shown in FIG. 5, the CDI-type component of the device having the outer annular region 50 is connected to another CDI-type component of the device, the other CDI-type component having a known construction. The CDI-type component having a known construction, and shown in FIG. 5, comprises a resistor, having a resistive part 54 within the thin layer 11, and defined by a combination of regions comprising a buried layer 55 at a portion of the interface 13, between the thin layer 11 and the substrate 10, and an isolation barrier 56 for the resistor extending through the thin layer to contact the buried layer 55. One end of the resistive part 54 is connected to the collector 12, 14 of the transistor with the outer annular region 50 by a connection 57, and an opposing end of the resistive part 54 is provided with a contact 58. The combination of regions 55, 56 of the resistor is also provided with a contact 59, so that the combination of regions 55, 56 is to be maintained at a predetermined potential level of 0 volts by a potential source 59" connected to the contact 59 via a connection 59'. The transistor with the outer annular region is substantially electrically isolated from the resistor, within the semiconductor body, by P-type regions of the thin layer 11, and by the substrate 10. Thus, in the operation of the circuit arrangement, a larger potential difference is provided between the collector 12, 14 of the transistor, and the substrate 10, compared with the potential difference provided between the combination of regions 55, 56 of the resistor and the substrate 10, even though the potential difference between the collector 12, 14 and the substrate 10 is lower than for the transistor of FIGS. 1 and 2. It is immaterial whether the potential difference between the collector 12, 14 and the substrate 10 is above or below 10 volts.

In a CDI-type component of a device according to the present invention a plurality of spaced, outer annular regions may be provided adjacent to the surface of the thin layer, and uniformly spaced from each other, as shown in FIG. 6, a resistive component part being defined between each adjacent pair of outer annular regions. The transistor of FIG. 6 comprises a modification of the transistor of FIGS. 1 and 2, and parts of the transistor of FIG. 6 identical to or closely resembling parts of the transistor of FIGS. 1 and 2 are given the same reference numerals as in FIGS. 1 and 2. In operation, three outer annular regions 60 are each maintained at a predetermined potential level intermediate between the potential level of the collector 12, 14 and the potential level of the regions 10, 11 of the device beyond the component and contiguous with the component. The potential differences between each of the outer annular regions 60 and the collector 12, 14 increase as the distance between the outer annular regions and the collector increases, the outer annular regions 60 having contacts 61 connected via connections 61' to appropriate potential sources 61'' for this purpose. The resistive parts between the outer annular regions 60 are indicated at 62. When a plurality of spaced, outer annular regions are provided the breakdown potential difference between the collector and the regions of the device beyond the component, and contiguous with the component, can be greater than for a component with only one outer annular region. Parasitic four layer action between adjacent pairs of outer annular regions may be prevented by providing a connection between the outermost of an adjacent pair of annular regions and the region of the thin layer between the adjacent pair of outer annular regions.

In another, unillustrated construction of a transistor having a plurality of outer annular regions an extension of the buried layer 12 of the collector extends beneath each of the outer annular regions, a resistive component part being provided between each outer annular region and the collector.

It is essential that either at least one outer annular region, or the surface portion of at least one region of the thin layer between the outer annular regions and the isolation barrier of the component, or both, is at a potential level between the potential level of the collector 12, 14, and the potential level of the regions of the device 10 and 11 beyond the transistor, but they need not be maintained at a suitable predetermined potential level, and may be floating, if the breakdown potential difference between the isolation barrier of the component and the regions of the device beyond the component, and contiguous with the component, are to be upto substantially twice the breakdown potential difference across the outer P-N junction serving partially to define the isolation barrier.

A circuit arrangement according to the present invention is at least partially embodied in a semiconductor device of one of the constructions described above. All the circuit arrangement except the potential sources may be embodied in the device.

The constructions of the illustrated CDI-type components described above may be modified in various ways.

Thus, the outer annular region 21 of FIGS. 1 and 2 may extend substantially through the thin layer 11, but is not provided with a buried layer, the resistive component part 20 being at least partially between such an outer annular region and the buried layer 12.

The P+ type surface portions of the unmodified regions of the epitaxial layer may be omitted.

The shape of the outer annular region in plan is required to be the same as the shape of the isolation barrier in plan, and may be rectangular, including being square shaped, or circular.

The CDI-type component having an outer annular region and a resistive component part may comprise any type of component, for example, a field-effect transistor or a resistor, instead of a bipolar transistor.

The other components of the device may not be CDI-type components of the known constructions, and may not be CDI-type components.

A device according to the present invention may have more than one component with a resistive part and an outer annular region.

It will be understood that the conductivity types of the regions of the semiconductor devices described above may be reversed.

In a semiconductor body of a device in accordance with the present invention the thin layer may not be an epitaxial layer. Further, regions of the same conductivity type as the thin layer may be provided in the thin layer, but these regions may not comprise unmodified regions of the thin layer.

What I claim is:

1. A semiconductor device formed in a semiconductor body comprising a substrate of one conductivity type, a thin layer initially wholly of said one conductivity type disposed on said substrate of the same conductivity type, said device having a plurality of constituent components, at least one of the components including a combination of regions comprising a buried layer of said opposite conductivity type at a portion of the interface between the thin layer and the substrate, and an isolation barrier for the component of said opposite conductivity type, the isolation barrier extending through the thin layer to the buried layer, regions of the device and of said one conductivity type extending beyond said at least one component, but contiguous with said at least one component, and said at least one component including at least one outer annular region of said opposite conductivity type, said annular region being disposed adjacent to the surface of the thin layer remote from the substrate, and being uniformly spaced from the combination of regions of said at least one component, and a significant resistance region between said at least one outer annular region and the combination of regions of said at least one component, said significant resistance region being a part of the component.

2. A semiconductor device as claimed in claim 1 in which the resistance of the resistive region of said at least one component is such that the breakdown potential difference between the combination of regions of said at least one component, and the regions of the device beyond, but contiguous with, said at least one component, can be at least 10 volts.

3. A semiconductor device as claimed in claim 1 in which means is provided whereby a potential difference can be provided between at least two spaced points of the device, so that a potential difference can be provided between the combination of regions of said at least one component, and the regions of the device beyond, but contiguous with, said at least one component.

4. A semiconductor device as claimed in claim 3 in which the means, whereby a potential difference can be provided between at least two spaced points of the device, at least includes a contact to the substrate of the semiconductor body, and a contact to the combination of regions of said at least one component.

5. A semiconductor device as claimed in claim 1 in which means is provided for removing breakdown current flowing between the combination of regions of said at least one component, and the regions of the device beyond, but contiguous with, said at least one component.

6. A semiconductor device as claimed in claim 5 in which the means provided for removing breakdown current includes a contact provided on the substrate of the semiconductor body.

7. A semiconductor device as claimed in claim 1 in which said at least one component is operably connected to at least one other component having a combination of regions comprising a buried layer of the opposite conductivity type at a portion of the interface between the thin layer and the substrate, and an isolation barrier of the opposite conductivity type for said at least one other component, the isolation barrier extending through the thin layer to the buried layer.

8. A semiconductor device as claimed in claim 1 in which a heavily doped portion of said one conductivity type is provided, adjacent to the surface of the thin layer remote from the substrate, in each region of the device within the thin layer, and of said one conductivity type.

9. A semiconductor device as claimed in claim 1 in which the thin layer is an epitaxial layer.

10. A semiconductor device as claimed in claim 1 in which a region of the device of said one conductivity type, and within the thin layer, is between said at least one component and each other component of the device.

11. A semiconductor device as claimed in claim 1 in which said at least one outer annular region of said at least one component does not extend to the interface between the thin layer and the substrate.

12. A semiconductor device as claimed in claim 11 in which, when the device is considered in plan, the buried layer of the combination of regions of said at least one component extends to be directly opposite, but is spaced from, at least part of said at least one outer annular region of the component.

13. A semiconductor device as claimed in claim 1 in which said at least one outer annular region of said at least one component extends to the interface between the thin layer and the substrate, and includes a buried layer at the interface.

14. A semiconductor device as claimed in claim 13 in which, when the device is considered in plan, the buried layer of the combination of regions of said at least one component extends beyond the isolation barrier.

15. A semiconductor device as claimed in claim 14 in which, when the device is considered in plan, the buried layer of said at least one outer annular region, at the interface between the thin layer and the substrate, extends beyond the remainder of said at least one outer annular region, and towards the combination of regions.

16. A semiconductor device as claimed in claim 1 in which a connection is provided between said at least one outer annular region and the surface portion of the region between said at least one outer annular region and the isolation barrier of said at least one component, so that the component parts connected together are maintained at a common potential level.

17. A semiconductor device as claimed in claim 16 in which the connection comprises a contact spanning a surface portion of the P-N junction between said at least one outer annular region and the region between said at least one outer annular region and the isolation barrier.

18. A semiconductor device as claimed in claim 1 in which a plurality of spaced, outer annular regions are provided in said at least one component adjacent to the surface of the thin layer remote from the substrate, and the plurality of outer annular regions being uniformly spaced from each other, a resistive component part being provided between each outer annular region and the combination of regions of said at least one component.

19. A semiconductor device as claimed in claim 18 in which a resistive component part is provided between each adjacent pair of outer annular regions.

20. A circuit arrangement, at least partially embodied in a semiconductor device, in a semiconductor body comprising a substrate of one conductivity type, a thin layer initially wholly of said one conductivity type disposed on said substrate of the same conductivity type, said device having a plurality of constituent components, at least one of the components including a combination of regions comprising a buried layer of said opposite conductivity type at a portion of the interface between the thin layer and the substrate, and an isolation barrier of said opposite conductivity type for the component, the isolation barrier extending through the thin layer to the buried layer, there being regions of the device and of said one conductivity type beyond said at least one component, but contiguous with said at least one component, and said at least one component including at least one outer annular region of said opposite conductivity type, said annular region being disposed adjacent to the surface of the thin layer remote from the substrate, and being uniformly spaced from the combination of regions, of said at least one component, and a significant resistance region between said at least one outer annular region and the combination of regions of at said at least one component, said significant resistance region being at least a portion of a part of the component, and the circuit arrangement also including means to maintain at least two spaced points of the device at different potential levels, the circuit arrangement being such that the potential level of at least one of the constitutent parts of said at least one component of the device comprising said at least one outer annular region and the combination of regions, is intermediate between the potential level of the combination of regions and the potential level of the regions of the device beyond, but contiguous with, said at least one component.

21. A circuit arrangement as claimed in claim 20 and in which a potential difference of at least 10 volts is applied between said at least two spaced points of the device to be maintained at different potential levels.

22. A circuit arrangement as claimed in claim 20 and in which a potential difference of at least 10 volts is applied between the combination of regions of said at least one component, and the regions of the device boyond, but contiguous with, said at least one component.

23. A circuit arrangement as claimed in claim 20 in which means is provided whereby at least one of the constituent parts of said at least one component of the device comprising said at least one outer annular region, and the surface portion of the region between said at least one outer annular region and the combination of regions, is maintained at a predetermined potential level intermediate between the potential level of the combination of regions, and the potential level of the regions of the device beyond, and contiguous with said at least one component.

24. A circuit arrangement as claimed in claim 23 in which said predetermined potential level is mid-way between the potential level of the combination of regions and the potential level of the regions of the device beyond, but contiguous with, said at least one component.

25. A circuit arrangement as claimed in claim 23 in which said at least one outer annular region, and the surface portion of the region between said at least one outer annular region and the combination of regions, of said at least one component, are maintained at the same predetermined potential level.

26. A circuit arrangement as claimed in claim 20 and in which means is provided for removing breakdown current flowing between the combination of regions of said at least one component, and the regions of the device beyond, but contiguous with, said at least one component, the means including a contact provided on the substrate of the semiconductor body, the circuit arrangement also including a potential source connected to the contact, to maintain the contact at an appropriate potential level.

27. A circuit arrangement as claimed in claim 20 and in which said at least one component is operably connected to at least one other component of the device, said at least one other component having a combination of regions comprising a buried layer of the opposite conductivity type at a portion of the interface between the thin layer and the substrate, and an isolation barrier of the opposite conductivity type for said at least one other component, the isolation barrier extending through the thin layer to the buried layer, the circuit arrangement being such that a larger potential difference is provided between the combination of regions of said at least one component, and the regions of the device beyond, and contiguous with, said at least one component, compared with the potential difference provided between the combination of regions of said at least one other component, and the regions of the device beyond, and contiguous with, said at least one other component.

28. A circuit arrangement as claimed in claim 20 and in which a plurality of spaced, outer annular regions are provided in said at least one component adjacent to the surface of the thin layer remote from the substrate, the plurality of outer annular regions being uniformly spaced from each other, a resistive component part being provided between each outer annular region and the combination of regions of said at least one component, and each outer annular region is maintained at a predetermined potential level intermediate between the potential level of the regions of th e device beyond the component and contiguous with the component, the potential differences between each of the outer annular regions and the combination of regions increasing as the distances between the outer annular regions and the combination of regions increases.

* * * * *